(12) United States Patent
Shigihara et al.

(10) Patent No.: US 8,238,397 B2
(45) Date of Patent: Aug. 7, 2012

(54) SEMICONDUCTOR LASER DEVICE

(75) Inventors: Kimio Shigihara, Tokyo (JP); Akihito Ono, Tokyo (JP); Shinji Abe, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 203 days.

(21) Appl. No.: 12/782,837

(22) Filed: May 19, 2010

(65) Prior Publication Data
US 2011/0128986 A1  Jun. 2, 2011

(30) Foreign Application Priority Data

Nov. 27, 2009  (JP) ................................ 2009-270109

(51) Int. Cl.
*H01S 5/00* (2006.01)

(52) U.S. Cl. ............... 372/43.01; 372/44.01; 372/45.01; 372/46.01

(58) Field of Classification Search ............... 372/43.01, 372/44.01, 45.01
See application file for complete search history.

(56) References Cited

U.S. PATENT DOCUMENTS 5,345,464 A * 9/1994 Takemoto ................ 372/46.014
5,438,208 A * 8/1995 Takemoto ...................... 250/551

OTHER PUBLICATIONS

Bisping, D., et al., High-Temperature High-Power Operation of GaInNAs Laser Diodes in the 1220-1240-nm Wavelength Range, *IEEE Photonics Technology Letters*, 20(21):1766-1768.

* cited by examiner

*Primary Examiner* — Dung Nguyen
(74) *Attorney, Agent, or Firm* — Leydig, Voit & Mayer, Ltd.

(57) ABSTRACT

A semiconductor laser device can suppress electrode-to-electrode resonance of laser light emitted from an active layer, increasing electrical conversion efficiency. The semiconductor laser device has a substrate and an active layer. The energy of the laser light emitted from the active layer is smaller than the band gap energy of the substrate, and the carrier concentration of the substrate is at least $2.2 \times 10^{18}$ cm$^{-3}$.

1 Claim, 10 Drawing Sheets

SEMICONDUCTOR LASER DEVICE

BACKGROUND OF THE INVENTION

1. Field of the Invention

The present invention relates to a semiconductor laser device having a substrate and an active layer, and in particular, to a technique which improves the electrical conversion efficiency of a semiconductor laser device for an excitation light source, such as a solid state laser such as an Nd-doped YAG (Nd:YAG) laser or a Yb-doped YAG (Yb:YAG) laser, a Yb-doped fiber laser, an Er-doped fiber amplifier, etc., as well as the electrical conversion efficiency of a semiconductor laser device for use as a light source for optical communication.

2. Description of the Related Art

In the past, a semiconductor laser device is formed, for example, by epitaxially growing, on an n type GaAs substrate, an n-type clad layer, a guide layer, an active layer, another guide layer, a p-type clad layer, a p-type contact layer, etc., in a sequential manner (see, for example, a first nonpatent document).

At this time, a carrier concentration of the GaAs substrate is set to about $1 \times 10^{18}$ cm$^{-3}$.

In general, it is said that a semiconductor laser device has a markedly high electrical conversion efficiency as compared with other laser devices, but further efficiency improvements are required under the strong demand of energy saving in recent years.

PRIOR ART REFERENCES

Non-patent Documents

First Non-Patent Document: D. Bisping et. al., IEEE Photon. Tecnol. Lett, Vol. 20, No. 21, pp. 1766-1768, 2008

SUMMARY OF THE INVENTION

Problems to be Solved by the Invention

A conventional semiconductor laser device had a problem in which it could not respond, to a sufficient extent, to the demand of efficiency improvements intended for energy saving in recent years.

The present invention has been made in order to solve the problems as referred to above, and has for its object to obtain a semiconductor laser device with a high electrical conversion efficiency.

Means for Solving the Problems

In a semiconductor laser device according to this invention which has a substrate and an active layer, and in which an energy of laser light emitted from the active layer is set to a value smaller than a band gap energy of the substrate, a carrier concentration of the substrate is set to a value equal to or more than $2.2 \times 10^{18}$ cm$^{-3}$.

Effect of the Invention

According to the present invention, by setting the carrier concentration of the substrate to a value equal to or more than $2.2 \times 10^{18}$ cm$^{-3}$, it is possible to suppress the electrode to electrode resonance of the laser light emitted from the active layer, thereby making it possible to increase an electrical conversion efficiency.

BEST MODES FOR CARRYING OUT THE INVENTION

First Embodiment

Figure 1:
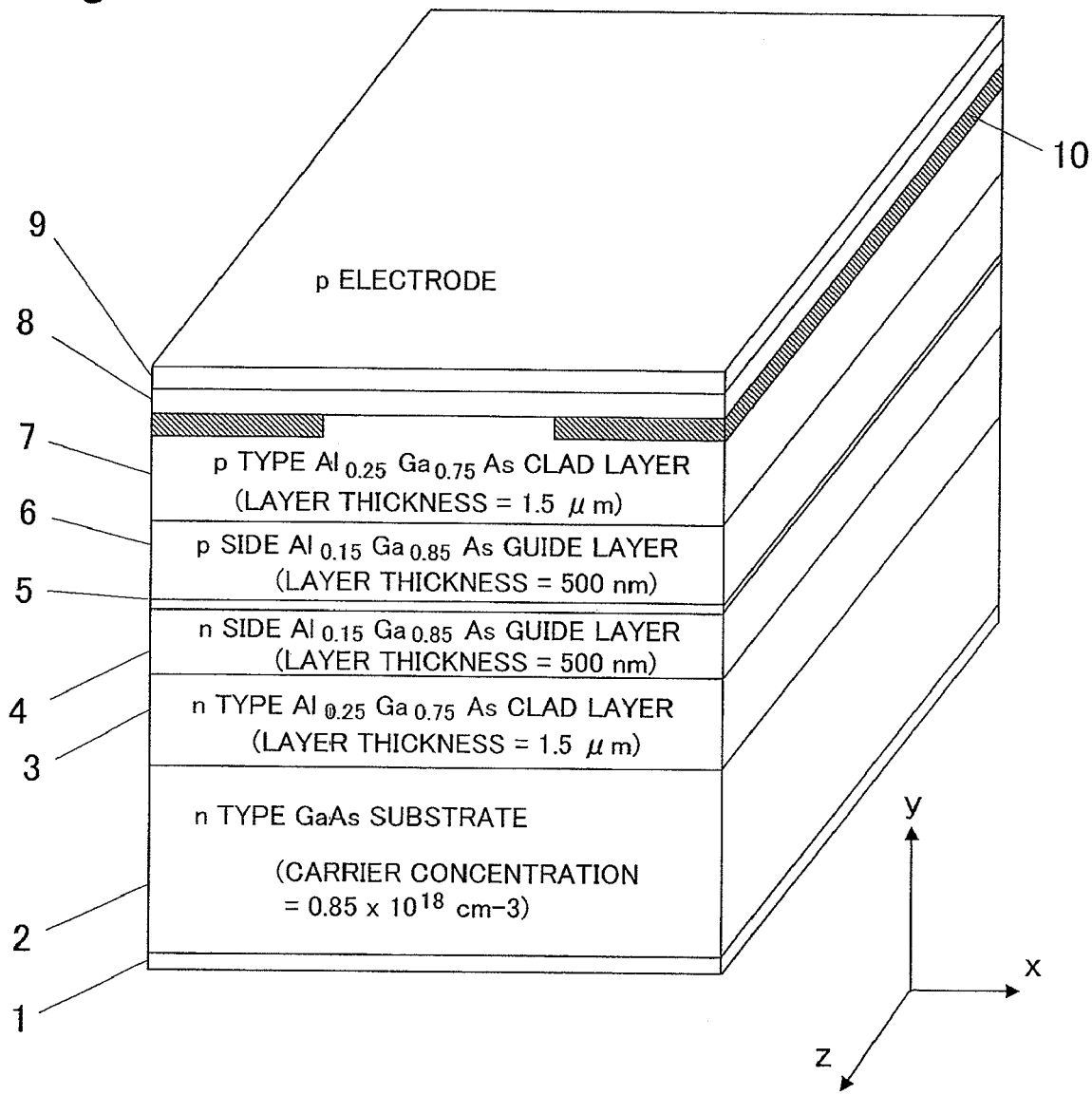
FIG. 1 is a perspective view showing a semiconductor laser device to which a first embodiment of the present invention is applied.

FIG. 1 is a perspective view showing a semiconductor laser device to which a first embodiment of the present invention is applied, wherein the construction thereof is illustrated in the case of the semiconductor laser device with an oscillation wavelength $\lambda_L$ of approximately 915 nm.

In FIG. 1, the semiconductor laser device is provided with an n electrode 1, an n type GaAs substrate (hereinafter referred to simply as a "substrate") 2, an n type AlGaAs clad layer (hereinafter referred to simply as an "n type clad layer") 3, an n side AlGaAs guide layer (hereinafter referred to simply as an "n side guide layer") 4, an InGaAs active layer (hereinafter referred to simply as an "active layer") 5, a p side AlGaAs guide layer (hereinafter referred to simply as a "p side guide layer") 6, a p type AlGaAs clad layer (hereinafter referred to simply as a "p type clad layer") 7, a p type GaAs contact layer 8, a p electrode 9, and a proton implantation region 10.

The substrate 2 has a carrier concentration of $0.85 \times 10^{18}$ cm$^{-3}$ and a band gap wavelength $\lambda_B$ of approximately 870 nm ($<\lambda_L$).

The n type clad layer 3 has an Al composition ratio of 0.25, a Ga composition ratio of 0.75, and a layer thickness of 1.5 µm, and the n side guide layer 4 has an Al composition ratio of 0.15, a Ga composition ratio of 0.85, and a layer thickness of 500 nm.

Here, the active layer 5 has an In composition ratio of 0.07, a Ga composition ratio of 0.93, and a layer thickness of 12 nm, so its oscillation wavelength $\lambda_L$ becomes about 915 nm.

The p side guide layer 6 has an Al composition ratio of 0.15, a Ga composition ratio of 0.85, and a layer thickness of 500 nm, and the p type clad layer 7 has an Al composition ratio of 0.25, a Ga composition ratio of 0.75, and a layer thickness of 1.5 μm.

A bias in the forward direction is applied to the semiconductor laser device of FIG. 1, and electrons are injected from the n type clad layer 3, and holes (positive holes) is injected from the p type clad layer 7.

The electrons and holes injected in this manner are introduced into the active layer 5 through the n side guide layer 4 and the p side guide layer 6, respectively.

As a result, in the active layer 5, electrons and holes are recombined with each other, thus resulting in light emission.

Here, note that a stripe width (a region in which protons are not implanted) is set equal to 150 μm, and a resonator (cavity) length is set equal to 1,200 μm.

Figure 2:
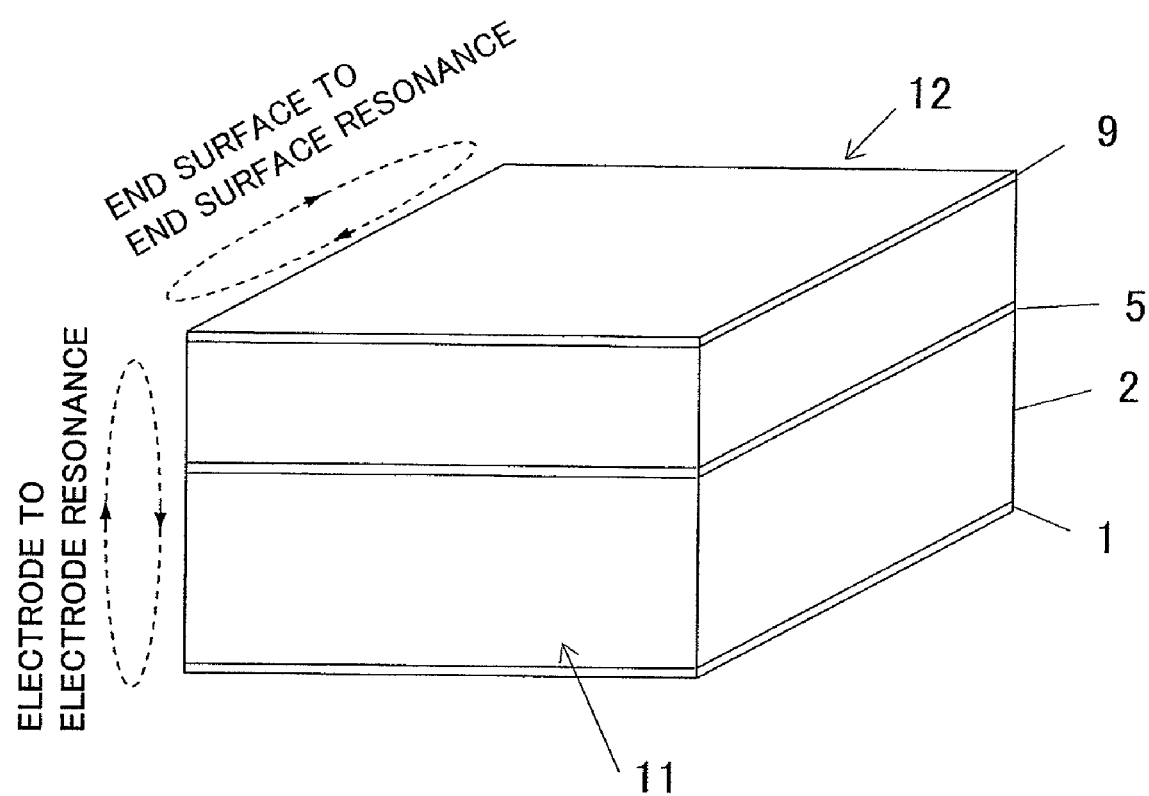
FIG. 2 is a perspective view schematically showing the resonance state of a laser beam emitted from the semiconductor laser device of FIG. 1.

FIG. 2 is a perspective view schematically showing the resonance state of laser light, wherein only the n electrode 1, the substrate 2, the active layer 5 and the p electrode 9 are representatively shown.

In FIG. 2, one end of each of the n electrode 1, the substrate 2, the active layer 5 and the p electrode 9 forms a front end surface 11, and each other end thereof forms a rear end surface 12.

In general, in the semiconductor laser device, laser light bounces back and forth between the front end surface 11 and the rear end surface 12 in a repeated manner while being amplified repeatedly, and at the time when the amplification becomes equal to a loss, oscillation takes place.

In the following, for the sake of convenience, a round trip of the laser light between the front end surface 11 and the rear end surface 12 is referred to as an "end surface to end surface resonance".

In addition, in a semiconductor laser device in which the energy of the laser light emitted from the active layer 5 is set to a value smaller than the band gap energy of the substrate 2, i.e., a semiconductor laser device in which the oscillation wavelength $\lambda_L$ (approximately 915 nm) is longer than the band gap wavelength $\lambda_B$ (approximately 870 nm) of the substrate 2, the oscillation wavelength $\lambda_L$ is not affected by the influence of the band to band absorption in the substrate 2.

Accordingly, it is said that the laser light goes back and forth between the n electrode 1 and the p electrode 9 which are metal.

In the following, for the sake of convenience, the round trip of the laser light between the n electrode 1 and the p electrode 9 is referred to as an "electrode to electrode resonance".

The presence of the electrode to electrode resonance causes the degradation of laser characteristics, such as efficiency reduction. In addition, as one of the features in the case of the presence of the electrode to electrode resonance, it is recited that modulations are seen in the spectrum at an interval equivalent to the distance between the electrodes.

Figure 3:
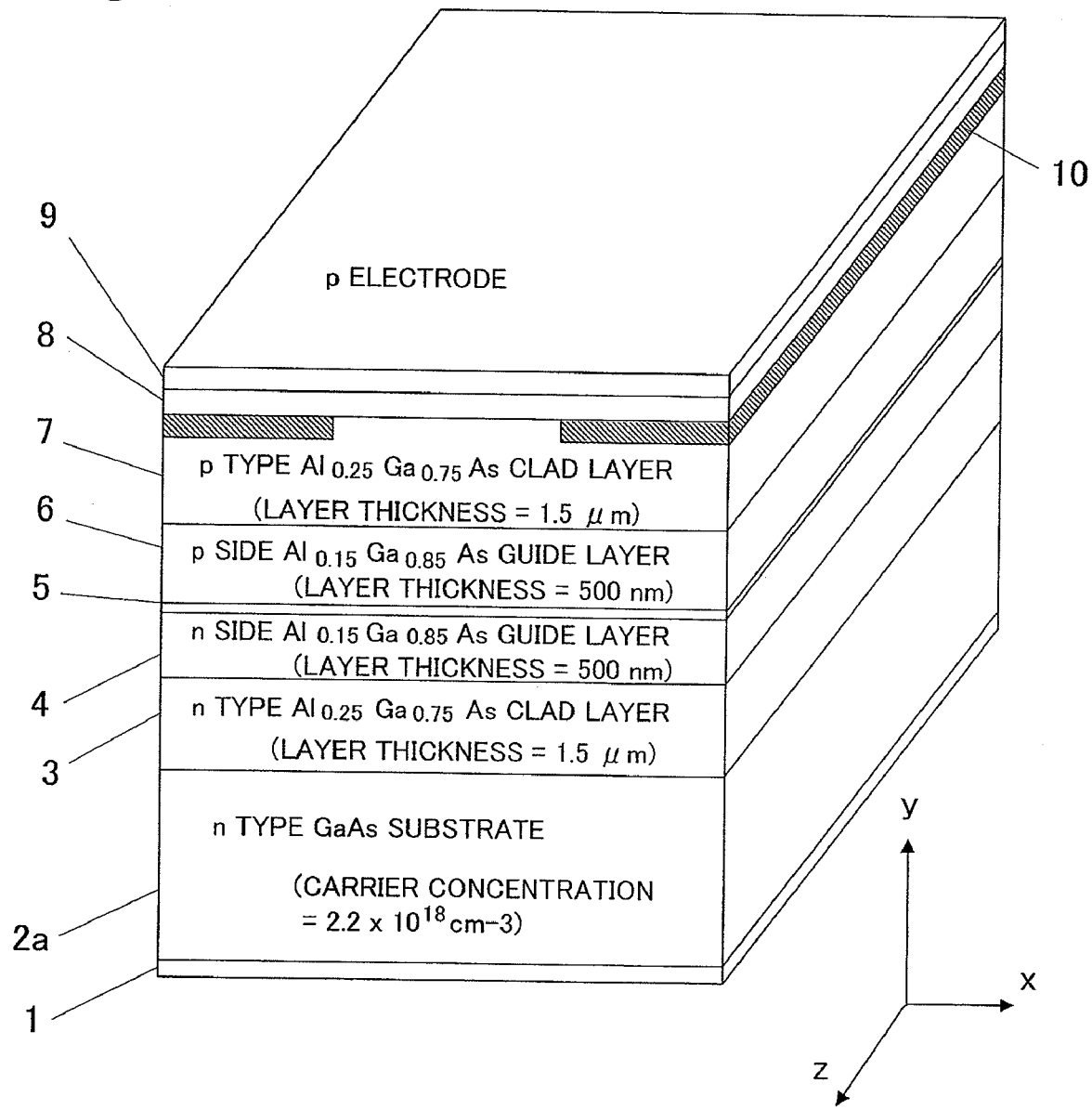
FIG. 3 is a perspective view showing a semiconductor laser device according to the first embodiment of the present invention.

FIG. 3 is a perspective view showing a semiconductor laser device according to the first embodiment of the present invention, wherein the semiconductor laser device with an oscillation wavelength $\lambda_L$ of approximately 915 nm is illustrated as in the case of FIG. 1.

In FIG. 3, those which are similar to the aforementioned ones (see FIG. 1) are denoted by the same reference numerals and characters as those in the aforementioned ones, while omitting a detailed explanation thereof.

In this case, a substrate 2a has a carrier concentration of $2.2\times10^{18}$ cm$^{-3}$ and a band gap wavelength $\lambda_B$ of approximately 870 nm.

Here, note that the oscillation wavelength $\lambda_L$ (approximately 915 nm) is equivalent to an energy of 1.355 eV, and the band gap wavelength $\lambda_B$ (approximately 870 nm) of the substrate 2a is equivalent to an energy of 1.424 eV.

In addition, the oscillation wavelength $\lambda_L$ (approximately 915 nm), being longer than the band gap wavelength $\lambda_B$ (approximately 870 nm) of the substrate 2a as stated above, is not affected by the influence of the band to band absorption of the substrate 2a.

Figure 4:
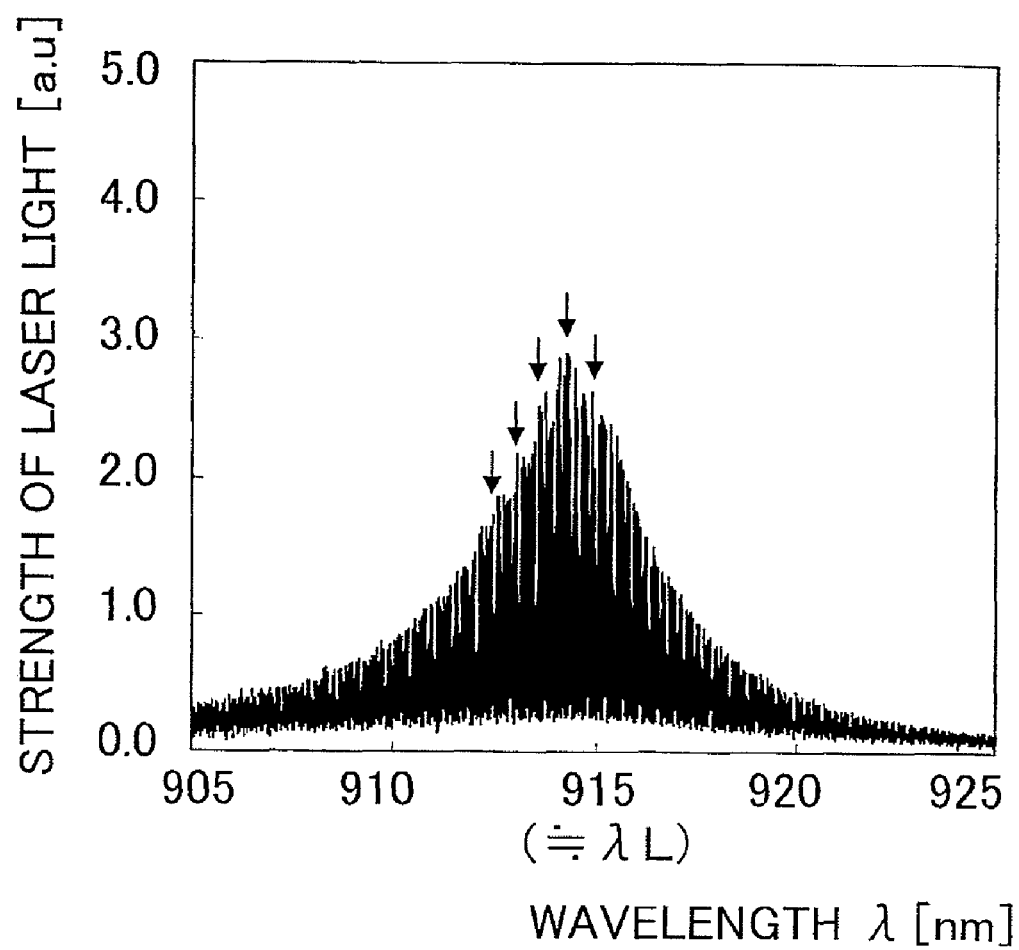
FIG. 4 is an explanatory view showing the spectrum of the laser beam emitted from the semiconductor laser device of FIG. 1.
Figure 5:
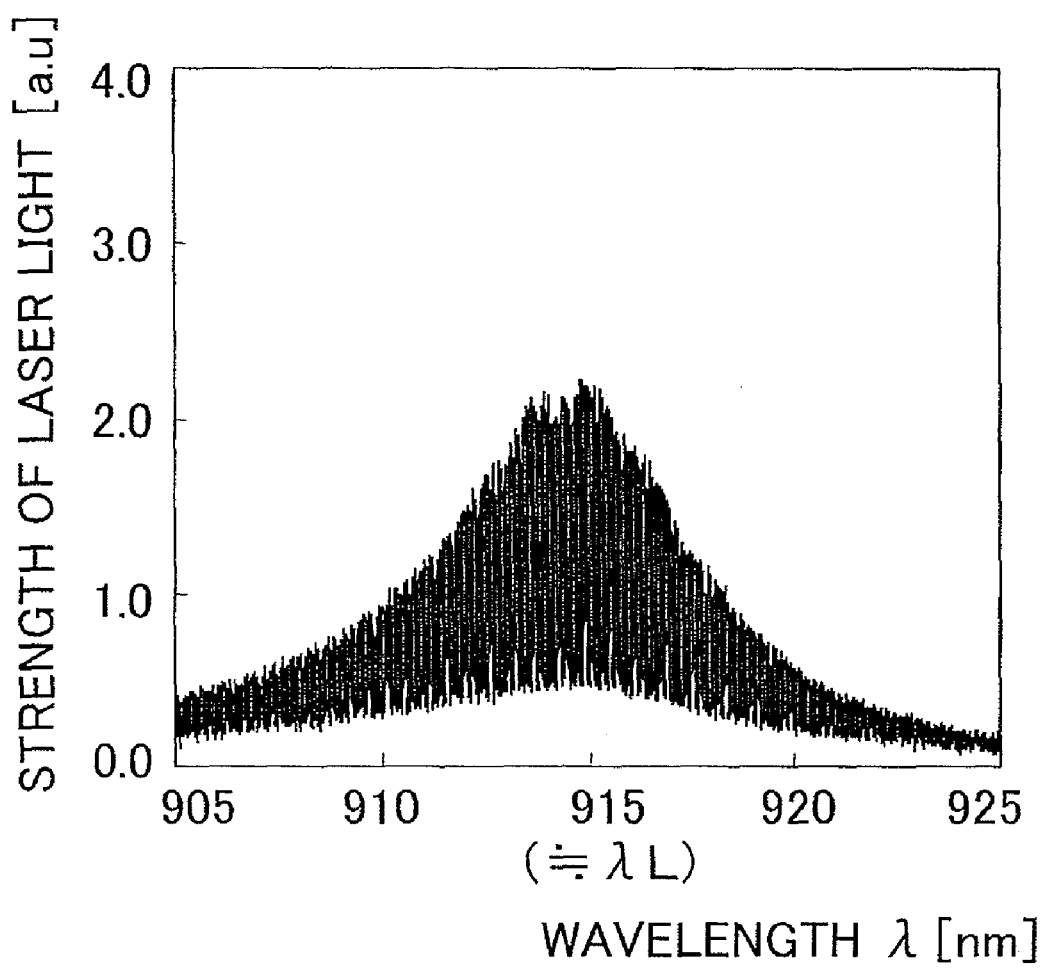
FIG. 5 is an explanatory view showing the spectrum of a laser beam emitted from the semiconductor laser device of FIG. 3.

FIG. 4 and FIG. 5 are explanatory views respectively showing spectrums (parts of experimental results) at current values less than a threshold at the time when the carrier concentration of the substrate was changed, wherein FIG. 4 shows a spectrum in the case where the carrier concentration of the substrate is $0.85\times10^{18}$ cm$^{-3}$, and FIG. 5 shows a spectrum in the case where the carrier concentration of the substrate is $2.2\times10^{18}$ cm$^{-3}$.

That is, FIG. 4 corresponds to a semiconductor laser device in general (FIG. 1) using the substrate 2, and FIG. 5 corresponds to the semiconductor laser device (FIG. 3) according to the first embodiment of the present invention using the substrate 2a.

Here, FIG. 4 and FIG. 5 are compared with each other for the purpose of clarifying the effects obtained by the first embodiment (FIG. 3) of the present invention. In FIG. 4 and FIG. 5, the axis of abscissa represents the wavelength of laser light [nm], and the axis of ordinate represents the strength of laser light [a. u.].

In FIG. 4, as indicated by an arrow, it is understood that the spectrum is modulated at intervals of about 1.0 nm (corresponding to the thickness of the substrate). This shows that there occur not only an end surface to end surface resonance but also an electrode to electrode resonance.

On the other hand, in FIG. 5, it is found that the spectrum modulation at an interval of about 1.0 nm substantially disappear.

As can be seen from FIG. 5, the electrode to electrode resonance substantially disappears by setting the carrier concentration of the substrate 2a to $2.2\times10^{18}$ cm$^{-3}$ (the carrier concentration of the substrate 2 in FIG. 1 being equal to or more than twice of $0.85\times10^{18}$ cm$^{-3}$), as shown in FIG. 3.

Accordingly, it is estimated that the spectrum characteristics can be improved to a great extent in the semiconductor laser device using the substrate 2a with a carrier concentration of $2.2\times10^{18}$ cm$^{-3}$ or more, as shown in FIG. 3.

Figure 6:
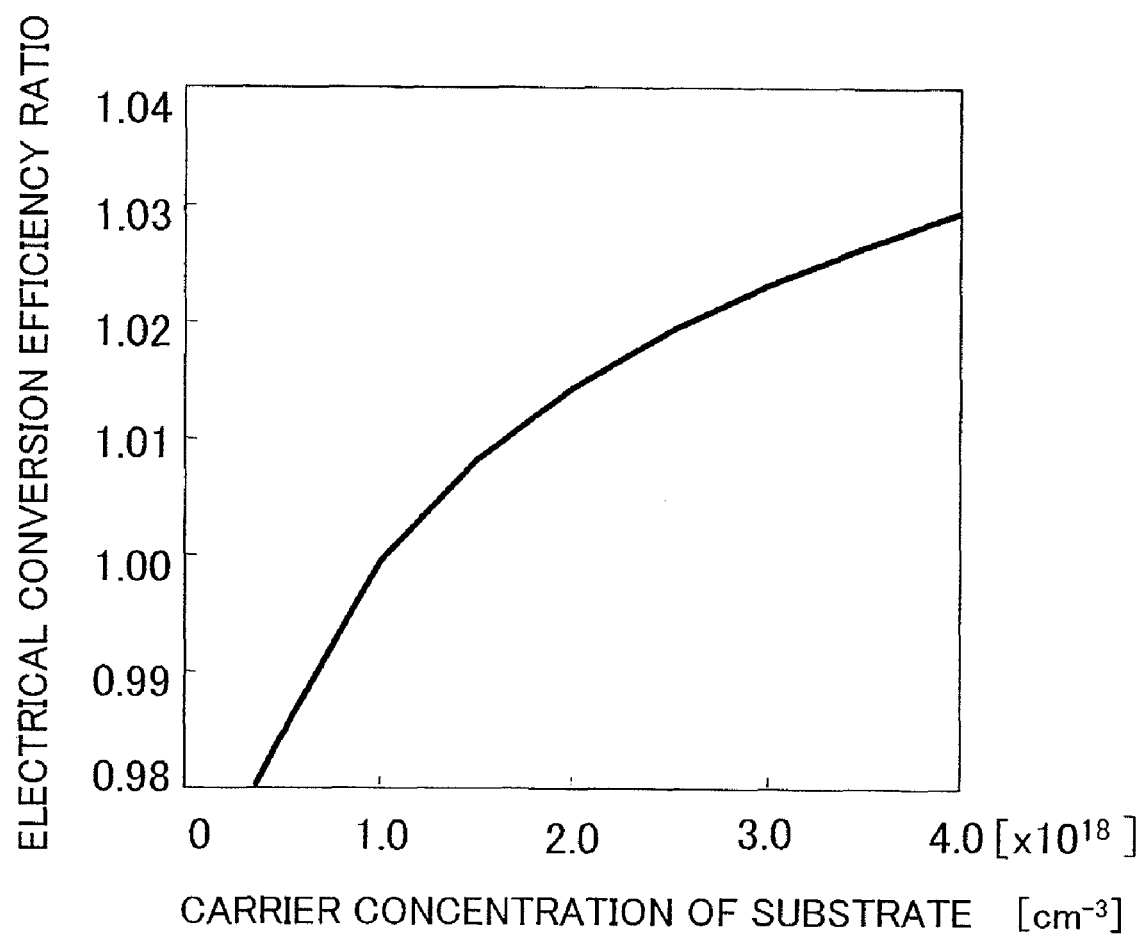
FIG. 6 is a characteristic view showing the ratio of electrical conversion efficiency of the semiconductor laser devices.

FIG. 6 is a characteristic view showing the ratio of electrical conversion efficiency of the semiconductor laser devices, wherein the electrical conversion efficiency is a value which is obtained by dividing an optical output (=3.2 W) from each semiconductor laser device by an injected electric power at that time, and the dependence of an electrical conversion efficiency ratio (the axis of ordinate) with respect to the carrier concentration of the substrate (the axis of abscissa) is shown.

In FIG. 6, the electrical conversion efficiency ratio (the axis of ordinate) is a value which is obtained by normalizing the carrier concentration of the substrate (=$1\times10^{18}$ cm$^{-3}$) by the electrical conversion efficiency.

As is clear from FIG. 6, the higher the carrier concentration of the substrate is set, the more the electrical conversion efficiency is improved.

Here, when investigating the details of the improvement in the electrical conversion efficiency due to the control of the electrode to electrode resonance, it can be confirmed that an improvement in the slope efficiency has a great effect.

In other words, it can be considered that the suppression of the electrode to electrode resonance is caused not due to the absorption of free carriers by the carriers of the substrate, but rather due to the occurrence of an essential phenomenon that laser light prohibits penetrating into a substrate side because of the increased reflection between the substrate and the n type clad layer. That is, if the carrier concentration of the substrate is set to be high, the refractive index of the substrate will become low, so it is considered to be a cause that the substrate of a high carrier concentration acts just like metal, and hence becomes a material of a high reflection factor with respect to laser light.

Although in the above explanation, the individual guide layers 4, 6 and the individual clad layers 3, 7 are respectively composed of AlGaAs, they are not limited to this, but it goes without saying that the same effects can be obtained even if each of these layers is composed, for example, of InGaAsP or AlGaInP.

As described above, in the semiconductor laser device according to the first embodiment (FIG. 3) of this invention which has the substrate 2*a* and the active layer 5, and in which the energy of laser light emitted from the active layer 5 is set to a value smaller than the band gap energy of the substrate 2*a*, the carrier concentration of the substrate 2*a* is set to a value equal to or more than $2.2 \times 10^{18}$ cm$^{-3}$.

In this manner, by setting the carrier concentration of the substrate 2*a* to a value equal to or more than $2.2 \times 10^{18}$ cm$^{-3}$, the electrode to electrode resonance of laser light can be suppressed, as can be seen from FIG. 5 and FIG. 6 (the relation between the carrier concentration of the substrate and the characteristics of the semiconductor laser device), so it is possible to enhance the electrical conversion efficiency by suppressing the electrode to electrode resonance of the laser light emitted from the active layer 5.

Second Embodiment

Figure 7:
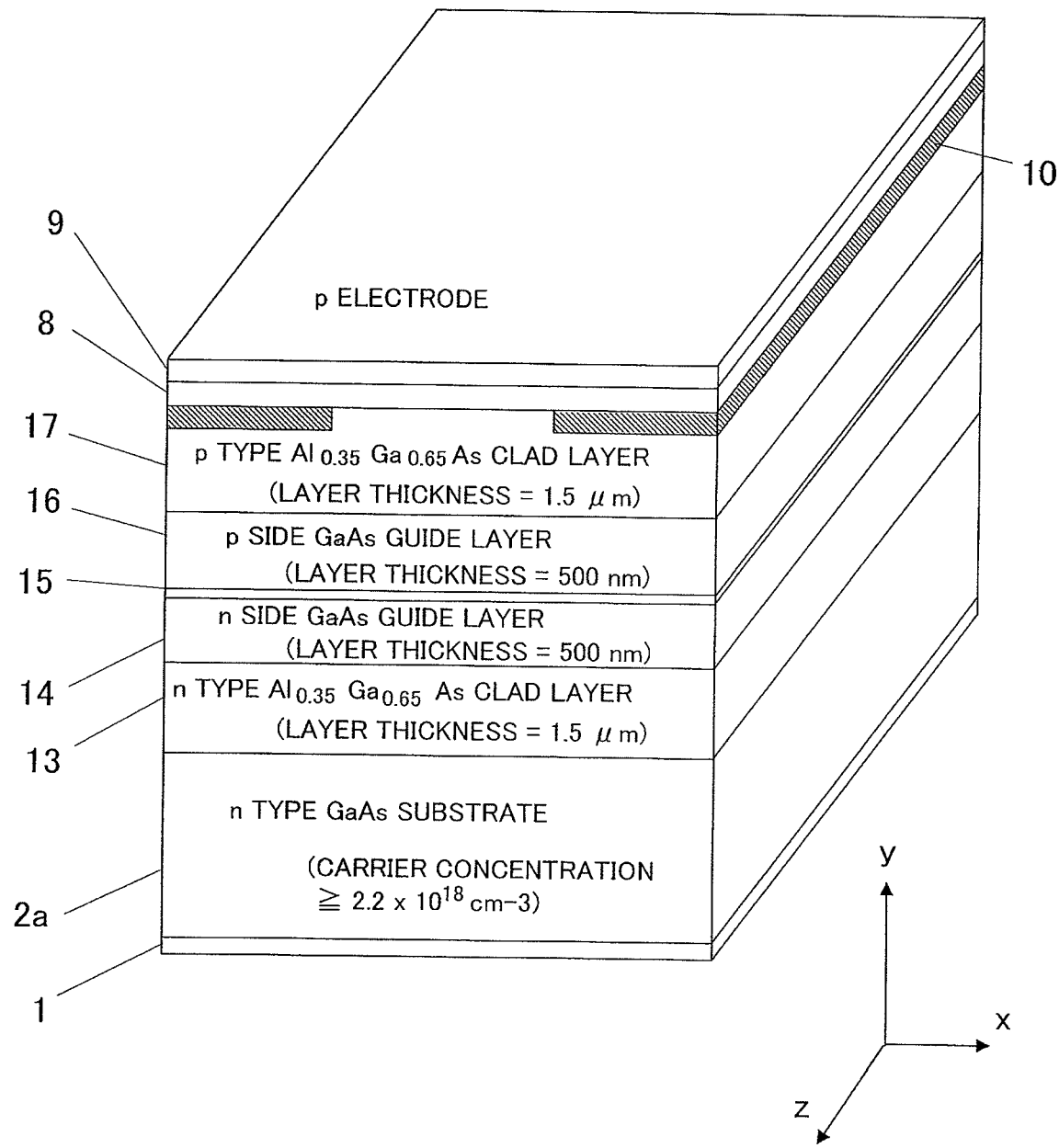
FIG. 7 is a perspective view showing a semiconductor laser device according to a second embodiment of the present invention.

Although in the above-mentioned first embodiment (FIG. 3), the substrate 2*a* has been applied to the semiconductor laser device with an oscillation wavelength $\lambda_L$ of approximately 915 nm, the substrate 2*a* may be applied to a semiconductor laser device with an oscillation wavelength $\lambda_L$ of approximately 1,060 nm, as shown in FIG. 7.

FIG. 7 is a perspective view showing a semiconductor laser device according to a second embodiment of the present invention, wherein the construction thereof is illustrated in the case of the semiconductor laser device with an oscillation wavelength $\lambda_L$ of approximately 1,060 nm.

In FIG. 7, those which are similar to the aforementioned ones (see FIG. 3) are denoted by the same reference numerals and characters as those in the aforementioned ones, while omitting a detailed explanation thereof. In addition, individual layers 13 through 17 correspond to the individual layers 3 through 7 in FIG. 3, respectively.

In this case, the n type clad layer 13 has an Al composition ratio of 0.35, a Ga composition ratio of 0.65, and a layer thickness of 1.5 μm, and the n side guide layer 14 has a layer thickness of 500 nm.

In addition, the active layers 15 has an In composition ratio of 0.24, a Ga composition ratio of 0.76, and a layer thickness of 9 nm.

Moreover, the p side guide layer 16 has a layer thickness of 500 nm, and the p type clad layer 17 has an Al composition ratio of 0.35, a Ga composition ratio of 0.65, and a layer thickness of 1.5 μm.

In FIG. 7, the active layer 15 constitutes an "InGaAs quantum well" which has an In composition ratio of 0.24, a Ga composition ratio of 0.76, and a layer thickness of 9 nm, so its oscillation wavelength $\lambda_L$ becomes about 1,060 nm.

At this time, the oscillation wavelength $\lambda_L$ is longer than the band gap wavelength $\lambda_B$ of the substrate 2*a*, and hence it is not affected by the influence of the band to band absorption of the substrate 2*a*.

In addition, the carrier concentration of the substrate 2*a* is high (larger than or larger than $2.2 \times 10^{18}$ cm$^{-3}$), so a highly efficient semiconductor laser can be achieved without the generation of an electrode to electrode resonance.

Although in the above explanation, the individual guide layers 14, 16 and the individual cladding layers 13, 17 are respectively composed of AlGaAs, they are not limited to these, but it goes without saying that the same effects can be obtained even if each of these layers is composed, for example, of AlGaAs, InGaAsP or AlGaInP.

As described above, according to the second embodiment (FIG. 7) of the present invention, in the semiconductor laser device which has the substrate 2*a* and the active layer 15, and in which the energy of laser light emitted from the active layer 15 is set to a value smaller than the band gap energy of the substrate 2*a*, the carrier concentration of the substrate 2*a* is set to a value equal to or more than $2.2 \times 10^{18}$ cm$^{-3}$, as a result of which the electrode to electrode resonance of the laser light can be suppressed, similar to the above-mentioned first embodiment (FIG. 3), and it is possible to enhance the electrical conversion efficiency by suppressing the electrode to electrode resonance of the laser light emitted from the active layer 15.

Third Embodiment

Figure 8:
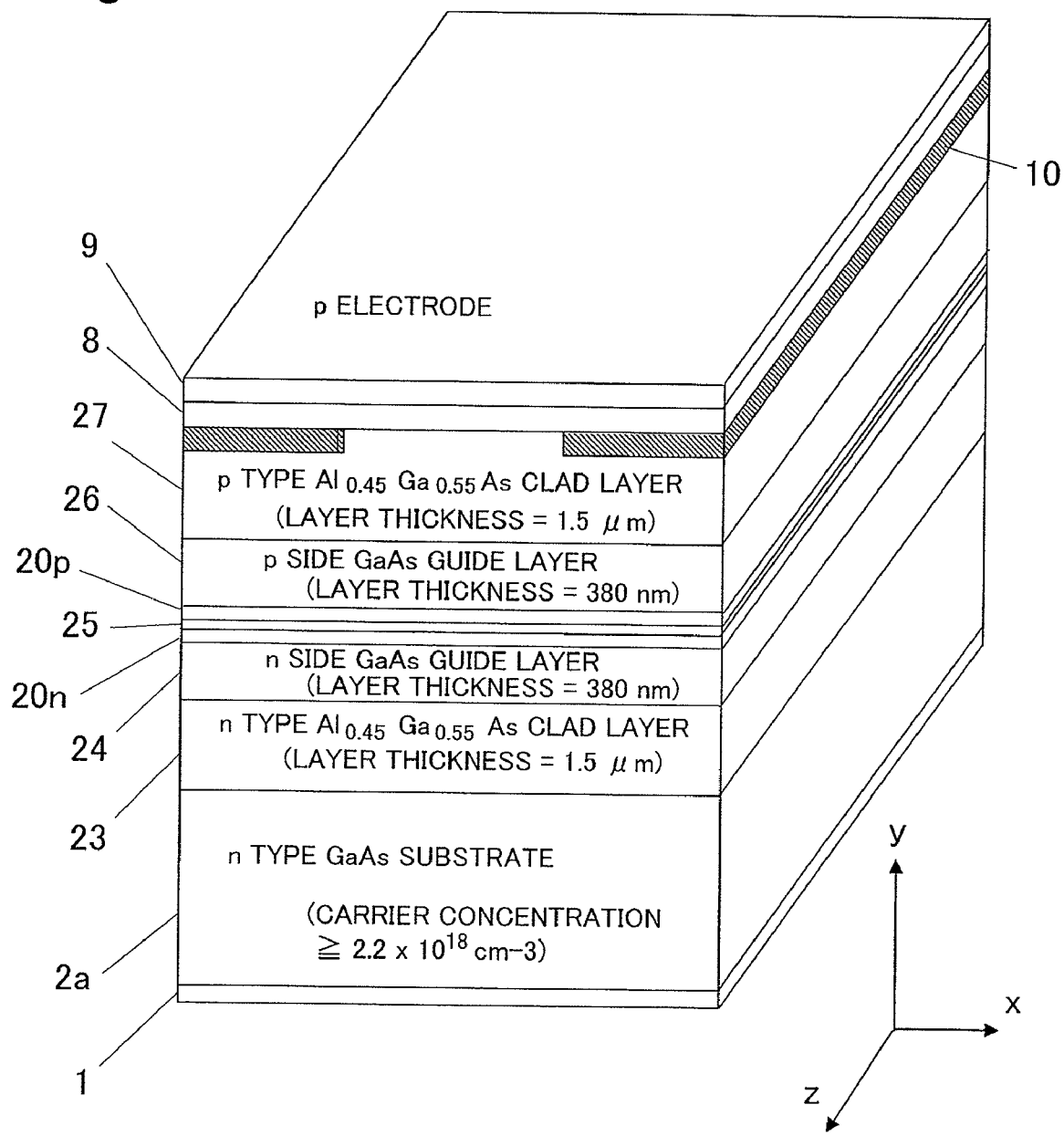
FIG. 8 is a perspective view showing a semiconductor laser device according to a third embodiment of the present invention.

Although in the above-mentioned second embodiment (FIG. 7), the substrate 2*a* has been applied to the semiconductor laser device with an oscillation wavelength $\lambda_L$ of approximately 1,060 nm, the substrate 2*a* may be applied to a semiconductor laser device with an oscillation wavelength $\lambda_L$ of approximately 1,220 nm, as shown in FIG. 8.

FIG. 8 is a perspective view showing a semiconductor laser device according to a third embodiment of the present invention, wherein the construction thereof is illustrated in the case of the semiconductor laser device with an oscillation wavelength $\lambda_L$ of approximately 1,220 nm.

In FIG. 8, those which are similar to the aforementioned ones (see FIG. 3 and FIG. 7) are denoted by the same reference numerals and characters as those in the aforementioned ones, while omitting a detailed explanation thereof.

In this case, the semiconductor laser device is provided, in addition to the same n electrode 1, the same substrate 2*a*, the same p type GaAs contact layer 8, the same p electrode 9, and the same proton implantation region 10, as those described above, with an n type AlGaAs clad layer (hereinafter referred to simply as a "n type clad layer") 23, an n side GaAs guide layer (hereinafter referred to simply as an "n side guide layer") 24, an GaInNAs active layer (hereinafter referred to simply as an "active layer") 25, a p side GaAs guide layer (hereinafter referred to simply as a "p side guide layer") 26, and a p type AlGaAs clad layer (hereinafter referred to simply as a "p type clad layer") 27.

In addition, an n side GaAsN strain compensation layer (hereinafter referred to simply as an "n side strain compensation layer") 20*n* and a p side GaAsN strain compensation layer (hereinafter referred to simply as an "n side strain compensation layer") 20*p* are arranged at the opposite sides of the active layer 25.

The n type clad layer 23 has an Al composition ratio of 0.45, a Ga composition ratio of 0.55, and a layer thickness of 1.5 μm, and the n side guide layer 24 has a layer thickness of 380 nm.

The active layer 25 has a Ga composition ratio of 0.68, an In composition ratio of 0.32, an N composition ratio of 0.007, an As composition ratio of 0.993, and a layer thickness of 6.5 nm.

In addition, the p side guide layer 26 has a layer thickness of 380 nm, and the p type clad layer 27 has an Al composition ratio of 0.45, a Ga composition ratio of 0.55, and a layer thickness of 1.5 μm.

Further, the n side strain compensation layer 20n has an N composition ratio of 0.01 and a layer thickness of 5 nm, and the p side strain compensation layer 20p has an N composition ratio of 0.01 and a layer thickness of 5 nm.

In FIG. 8, the active layer 25 constitutes an "GaInNAs quantum well" which has an In composition ratio of 0.32, an N composition ratio of 0.007, an As composition ratio of 0.993, and a layer thickness of 6.5 nm, so its oscillation wavelength $\lambda_L$ becomes about 1,220 nm.

At this time, the oscillation wavelength $\lambda_L$ is longer than the band gap wavelength $\lambda_B$ of the substrate 2a, and hence it is not affected by the influence of the band to band absorption of the substrate 2a.

In addition, the carrier concentration of the substrate 2a is high (larger than or equal to $2.2 \times 10^{18}$ cm$^{-3}$), so a highly efficient semiconductor laser can be achieved without the generation of an electrode to electrode resonance.

Although in the above explanation, the active layer 25 has been composed of GaInNAs, this layer is not limited to this, but it goes without saying that the same effects can be obtained even if the active layer 25 is composed, for example, of GaInNAsSb added by Sb.

In addition, in the above-mentioned first through third embodiments (FIG. 3, FIG. 7, FIG. 8), examples of a semiconductor laser device using a GaAs substrate as the substrate 2a have been shown, but even in the case of a semiconductor laser device which uses a GaN substrate as the substrate 2a, AlGaN as each clad layer, and InGaN as the active layer, the same effects as described above can be obtained by setting the carrier concentration of the substrate 2a to a value equal to or more than $2.2 \times 10^{18}$ cm$^{-3}$ because the oscillation wavelength $\lambda_L$ is longer than the band gap wavelength $\lambda_B$ of the substrate 2a.

As described above according to the third embodiment (FIG. 8) of the present invention, in the semiconductor laser device which has the substrate 2a and the active layer 25, and in which the energy of laser light emitted from the active layer 25 is set to a value smaller than the band gap energy of the substrate 2a, the carrier concentration of the substrate 2a is set to a value equal to or more than $2.2 \times 1.0^{18}$ cm$^{-3}$, as a result of which the electrode to electrode resonance of the laser light can be suppressed, similar to the above-mentioned first and second embodiments (FIG. 3, FIG. 7), and it is possible to enhance the electrical conversion efficiency by suppressing the electrode to electrode resonance of the laser light emitted from the active layer 25.

Fourth Embodiment

Figure 9:
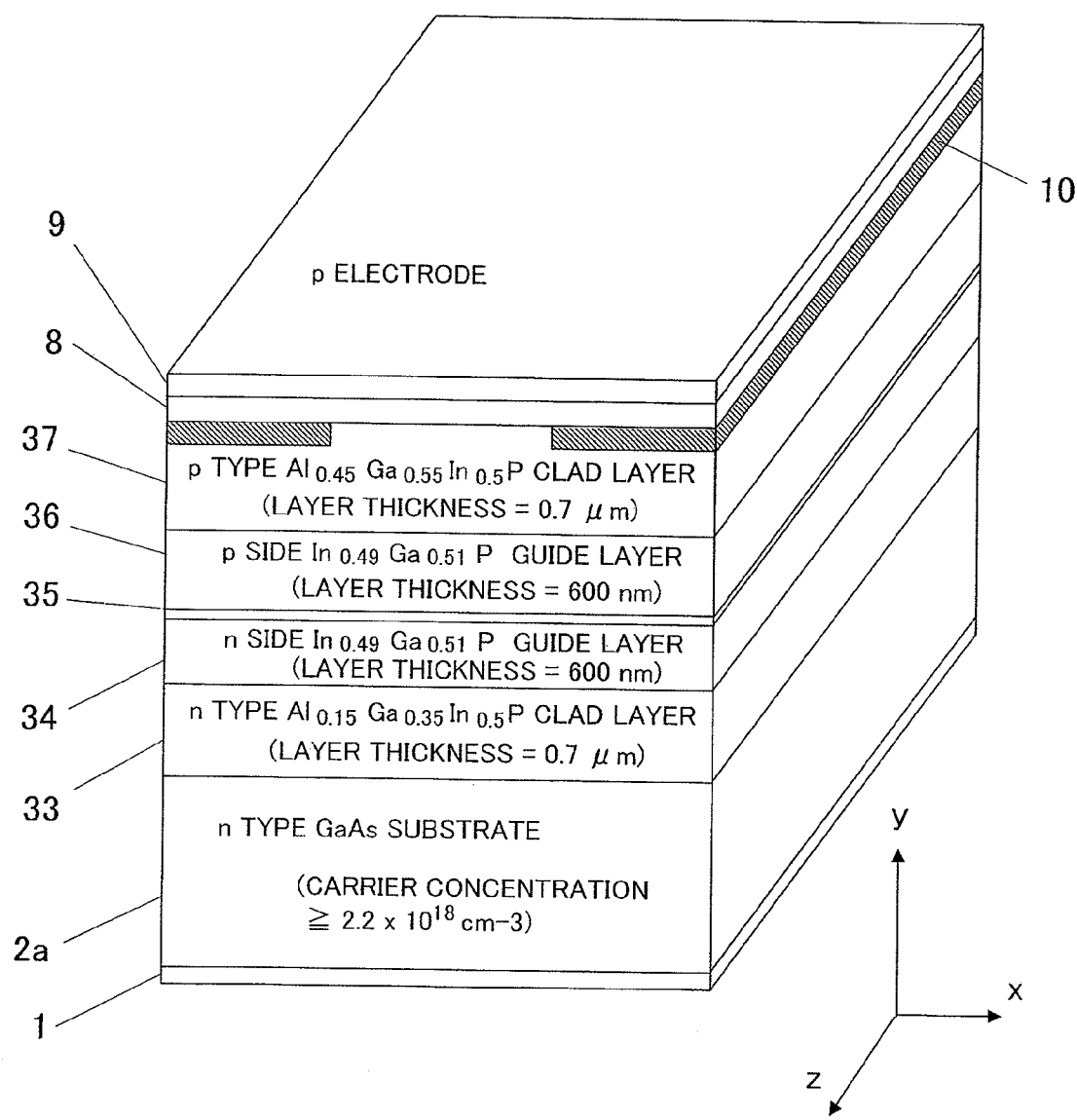
FIG. 9 is a perspective view showing a semiconductor laser device according to a fourth embodiment of the present invention.

Although in the above-mentioned first through third embodiments (FIG. 3, FIG. 7, FIG. 8), the substrate 2a has been applied to the semiconductor laser device in which the layer thickness of each of the clad layers is set to 1.5 μm (the oscillation wavelength $\lambda_L > \lambda_B$), the substrate 2a may be applied to a semiconductor laser device in which the layer thickness of each clad layer is set to 0.7 is μm (the oscillation wavelength $\lambda_L$ being approximately equal to 800 nm $< \lambda_B$), as shown in FIG. 9.

FIG. 9 is a perspective view showing a semiconductor laser device according to a fourth embodiment of the present invention, wherein the construction thereof is illustrated in the case of the semiconductor laser device with an oscillation wavelength $\lambda_L$ of approximately 800 nm.

In FIG. 9, those which are similar to the aforementioned ones (see FIG. 3 FIG. 7 and FIG. 8) are denoted by the same reference numerals and characters as those in the aforementioned ones, while omitting a detailed explanation thereof. In addition, individual layers 33 through 37 correspond to the individual layers 3 through 7 in FIG. 3, (the individual layers 13 through 17 in FIG. 7, and individual layers 23 through 27 in FIG. 8), respectively.

In this case, the semiconductor laser device is provided, in addition to the same n electrode 1, the same substrate 2a, the same p type GaAs contact layer 8, the same p electrode 9, and the same proton implantation region 10, as those described above, with an n type AlGaInP clad layer (hereinafter referred to simply as an "n type clad layer") 33, an n side InGaP guide layer 34, an GaAsP active layer (hereinafter referred to simply as an "active layer") 35, a p side InGaP guide layer (hereinafter referred to simply as a "p side guide layer") 36, and a p type AlGaInP clad layer (hereinafter referred to simply as a "p type clad layer") 37.

The n type clad layer 33 has an Al composition ratio of 0.15, a Ga composition ratio of 0.35, an In composition ratio of 0.5, and a layer thickness of 0.7 μm, and the n side guide layer 34 has an In composition ratio of 0.49, a Ga composition ratio of 0.51, and a layer thickness of 600 nm.

In addition, the active layer 35 of an oscillation wavelength $\lambda_L$ has an In composition ratio of 0.88, a P composition ratio of 0.12, and a layer thickness of 12 nm.

Further, the p side guide layer 36 has an In composition ratio of 0.49, a Ga composition ratio of 0.51, and a layer thickness of 600 nm, and the p type clad layer 37 has an Al composition ratio of 0.15, a Ga composition ratio of 0.35, an In composition ratio of 0.5, and a layer thickness of 0.7 μm.

In FIG. 9, the active layer 35 constitutes an "GaAsP quantum well" which has an P composition ratio of 0.12 and a layer thickness of 12 nm, so its oscillation wavelength $\lambda_L$ becomes about 800 nm, and is shorter than the band gap wavelength $\lambda_B$ (approximately 870 nm) of the substrate 2a.

In this case, a difference in energy between the oscillation wavelength $\lambda_L$ and the band gap wavelength $\lambda_B$ of the substrate 2a is about 130 meV or less.

Here, note that a stripe width (a region in which protons are not implanted) is set equal to 200 μm, and a resonator (cavity) length is set equal to 1,200 μm.

Figure 10:
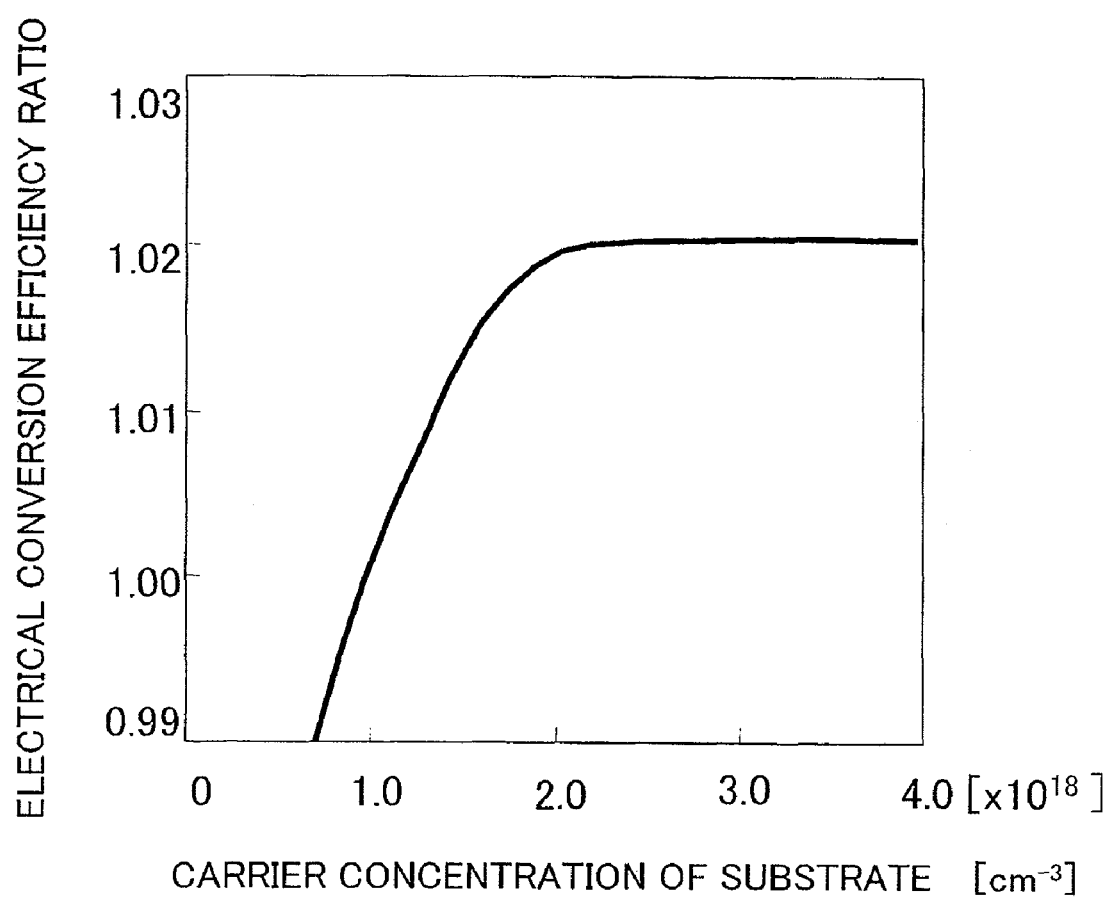
FIG. 10 is a characteristic view showing the ratio of electrical conversion efficiency of the semiconductor laser device of FIG. 9.

FIG. 10 is a characteristic view showing the electrical conversion efficiency of the semiconductor laser device of FIG. 9, wherein similar to the foregoing (FIG. 6), the electrical conversion efficiency is a value which is obtained by dividing an optical output (=3.2 W) from the semiconductor laser device by an injected electric power at that time, and the dependence of an electrical conversion efficiency ratio (the axis of ordinate) with respect to the carrier concentration of the substrate (the axis of abscissa) is shown.

In FIG. 10, the electrical conversion efficiency ratio (the axis of ordinate) is a value which is obtained by normalizing the carrier concentration of the substrate (=$1 \times 10^{18}$ cm$^{-3}$) of FIG. 1 by the electrical conversion efficiency.

As is clear from FIG. 10, the higher the carrier concentration of the substrate is set, the more the electrical conversion efficiency is improved, and when the carrier concentration of the substrate is equal to or more than $2.2 \times 10^{18}$ cm$^{-3}$, the electrical conversion efficiency tends to be saturated.

In this case, the oscillation wavelength $\lambda_L$ is shorter than the band gap wavelength $\lambda_B$ of the substrate 2a, and hence it is not affected by the influence of the band to band absorption of the substrate 2a. However, because the difference in energy between the oscillation wavelength $\lambda_L$ and the band gap wavelength $\lambda_B$ of the substrate 2a (equal to or less than 130 meV) is limited, it is considered that the absorption coefficient is small.

As shown in FIG. 10, it can be seen that in cases where the energy difference is about 130 meV or less, it is possible to certainly improve the electrical conversion efficiency by setting the carrier concentration of the substrate 2a to a value of $2.2 \times 10^{18}$ cm$^{-3}$ or more.

That is, when the relation between the carrier concentration of the substrate 2a and the characteristics of the semiconductor laser device is closely examined, it can be confirmed that even in cases where the energy of the laser light emitted from the active layer 35 is set to a value larger than the band gap energy of the substrate 2a, the electrical conversion efficiency of the semiconductor laser device becomes high when the difference between the energy of the laser light and the band gap energy of the substrate 2a is 130 meV or less.

Accordingly, there is an effect of improving the efficiency by setting the difference between the energy of the laser light and the band gap energy of the substrate 2a to a value of 130 meV or less, and also by setting the carrier concentration of the substrate 2a to a value of $2.2 \times 10^{18}$ cm$^{-3}$ or more.

Although in the above-mentioned explanation, the active layer 35 has been composed of GaAsP, the layer is not limited to this, but it goes without saying that the same effects can be obtained even if the active layer 35 is composed, for example, of InGaAsP or AlGaAs.

In addition, although each of the guide layers 34, 36 has been composed of InGaP and each of the clad layers 33, 37 has been composed of AlGaInP, these layers are not limited to these, but the same effects can be obtained even if each of the guide layers 34, 36 is composed of AlGaAs, InGaAsP, or AlGaInP, and even if each of the clad layers 33, 37 is composed of AlGaAs or InGaAsP.

As described above, according to the fourth embodiment (FIG. 9) of the present invention, in the semiconductor laser device which has the substrate 2a and the active layer 35, and in which the energy of laser light emitted from the active layer 35 is set to a value larger than the band gap energy of the substrate 2a, the difference between the energy of the laser light and the band gap energy of the substrate 2a is set to a value equal to or less than 130 meV, and the carrier concentration of the substrate 2a is set to a value equal to or more than $2.2 \times 10^{18}$ cm$^{-3}$, as a result of which the efficiency of the semiconductor laser device can be raised.

In addition, when the carrier concentration of the substrate 2a is set to be high, the electrical resistivity of the substrate 2a becomes low, as in the above-mentioned first through fourth embodiments (FIG. 3, FIG. 7 through FIG. 9), so there is also an effect of reducing the operating voltage of the semiconductor laser device. As a result, an effect can be expected which further improves the optical output (the electrical conversion efficiency) with respect to the injected electric power.

Here, note that the higher the carrier concentration of the substrate 2a is set to be, the more the effect is increased, as shown in the above-mentioned first through fourth embodiments (FIG. 6, FIG. 10), but the carrier concentration of the substrate 2a is required to be in a range in which the crystallinity of the substrate 2a is not damaged, so an upper limit of the carrier concentration of the substrate 2a is considered to be about $1 \times 10^{19}$ cm$^{-3}$.

Moreover, dopants (impurities to be doped) in the substrate 2a have a tendency that the higher the temperature thereof, the easier they become to move, so a semiconductor laser device of a structure formed in one epitaxial growth step is more effective as an object to which the above-mentioned first through fourth embodiments are applied than a semiconductor laser device in which a growth step is performed again after a first epitaxial growth step.

Similarly, it is preferable that a wafer process after epitaxial growth be not carried out in a high temperature state as much as possible, so for example, the use of proton implantation as in the above-mentioned first through fourth embodiments is a desirable method because a current constricting structure is formed at room temperature.

Further, an electrode to electrode resonance phenomenon tends to take place in a semiconductor laser device using a GaAs substrate as the substrate 2a, so the present invention is in particular effective in a semiconductor laser device using GaAs as a material of the substrate 2a.

What is claimed is:

1. A semiconductor laser device comprising:
   an n-type GaAs substrate having a band gap energy and opposed first and second sides;
   an active layer supported by and at the first side of said GaAs substrate;
   first and second cladding layers sandwiching said active layer, wherein said first cladding layer is located between said active layer and said GaAs substrate;
   a first electrode disposed on the second side of said GaAs substrate; and
   a second electrode in electrical communication with said active layer through said second cladding layer, wherein
      each of said active layer, said first and second cladding layers, and said GaAs substrate has end surfaces at opposed first and second end surfaces of said semiconductor laser device,
      said first and second electrodes are transverse to said first and second end surfaces,
      laser light having an energy is generated in said active layer in response to an electrical current flowing between said first and second electrodes,
      the laser light resonates between said first and second end surfaces and between said first and second electrodes,
      the energy of the laser light generated is smaller than the band gap energy of said GaAs substrate, and
      said GaAs substrate has a charge carrier concentration of at least $2.2 \times 10^{18}$ cm$^{-3}$ so that resonance of the laser light between said first and second electrodes is suppressed.

* * * * *